United States Patent [19]
Nutter et al.

[11] Patent Number: 5,785,233
[45] Date of Patent: Jul. 28, 1998

[54] APPARATUS AND METHOD FOR SOLDER REFLOW BOTTOM COOLING

[75] Inventors: Francis C. Nutter, Methuen; Martin I. Soderland, Westboro; Richard J. Nihan, Dracut, all of Mass.

[73] Assignee: BTU International, Inc., North Billerica, Mass.

[21] Appl. No.: 595,274

[22] Filed: Feb. 1, 1996

[51] Int. Cl.⁶ .................................................. H05K 3/34
[52] U.S. Cl. .................... 228/46; 219/288; 432/152
[58] Field of Search .................. 228/42, 46, 218, 228/222; 219/388; 432/152; 65/348; 266/258, 259

[56] References Cited

U.S. PATENT DOCUMENTS

| | | |
|---|---|---|
| 2,674,809 | 4/1954 | Meienhofer . |
| 2,820,131 | 1/1958 | Kodama . |
| 3,710,069 | 1/1973 | Papadopoulos et al. .......... 219/85 |
| 3,813,224 | 5/1974 | Hollander . |
| 3,882,596 | 5/1975 | Kendziora et al. ............ 228/200 |
| 3,937,388 | 2/1976 | Zimmerman ................. 228/222 |
| 4,270,260 | 6/1981 | Krueger ..................... 29/403.4 |
| 4,408,400 | 10/1983 | Colapinto ........................ 34/4 |
| 4,436,985 | 3/1984 | Weber ......................... 219/388 |
| 4,725,716 | 2/1988 | Enwistle et al. ............. 219/388 |
| 4,832,249 | 5/1989 | Ehler .......................... 228/102 |
| 5,039,841 | 8/1991 | Kato et al. ................. 219/388 |
| 5,066,850 | 11/1991 | Kondo ........................ 219/388 |
| 5,154,338 | 10/1992 | Okuno et al. ................. 228/42 |
| 5,296,680 | 3/1994 | Yamada ....................... 219/388 |
| 5,358,166 | 10/1994 | Mishina et al. ............... 228/42 |
| 5,433,368 | 7/1995 | Spigarelli .................... 228/46 |
| 5,577,658 | 11/1996 | Bailey et al. ................ 228/222 |

*Primary Examiner*—Samuel M. Heinrich
*Attorney, Agent, or Firm*—Weingarten, Schurgin, Gagnebin & Hayes LLP

[57] ABSTRACT

An apparatus and method for cooling one side of a double sided product as the product is being reflow soldered is presented. A cooling assembly directs cold gas to a first side of the product which has previously had the first side reflow soldered, while at approximately the same time, a heating assembly directs hot gas to a second side of the product. The second side of the product is reflow soldered while the first side of the product is maintained at a temperature below the melting point of the solder.

16 Claims, 2 Drawing Sheets

5,785,233

APPARATUS AND METHOD FOR SOLDER REFLOW BOTTOM COOLING

FIELD OF THE INVENTION

The invention relates generally to reflow soldering of products, and more particularly to reflow soldering of a double sided product.

BACKGROUND OF THE INVENTION

Double sided products such as printed circuit boards are more difficult to reflow solder than single sided products since special care must be directed to the components already soldered on one side of the product to prevent them from shifting position or falling off while the other side is being reflow soldered. In a typical double-sided product assembly process, a first side of the product has preformed solder and components placed onto it. The product is then put through a reflow furnace where the preformed solder melts. The product then cools and the molten solder solidifies, thereby making electrical and mechanical connections between the product surface and the components. The product is then turned over and preformed solder and components are placed on the second side of the product. When the second side of the product is brought up to a high enough temperature to cause the deposited solder on the second side to melt, the first side of the product may also be at a high enough temperature such that the solder on the first side of the product may also melt. As a result, components located on the first side may fall off or shift position.

Various procedures to prevent the components on one side of a product from shifting or falling off while a second side of the product is being reflow soldered have been attempted. In one approach, adhesives have been used to secure the first side components to the product. The first side of the product has preformed solder and adhesive deposited onto it. The first side components are then placed on the adhesive and preformed solder. The adhesive may be cured at room temperature or at a higher temperature as part of the reflow process. In this approach, after the first side has been reflow soldered, resulting in the first side components being mechanically and adhesively attached to the product surface, the second side has preformed solder and components deposited thereon and the product is reflow soldered again to attach the second side components to the second side of the product. The adhesive acts to secure the first side components to the first side of the product, despite the solder melting. The drawbacks associated with this procedure are that adhesives are messy, difficult to use and cause problems when a component which has been adhesively mounted needs to be removed.

Another procedure for reflow soldering double sided product involves the use of solders having different melting temperatures. A higher melting temperature solder is used on the first side of the product which is reflow soldered before the second side of the product is reflow soldered. A lower melting temperature solder is used on the second side. As the second side of the board is reflow soldered, the temperature of the product is maintained below that of the melting temperature of the first side solder so that first side soldered components do not fall off or shift position. The drawbacks associated with this process include the close monitoring of the temperatures used in the reflow process and the necessity of two different solder materials.

Another approach involves the heatsinking of first side components while the second side is being reflow soldered. In this approach the first side of the product is reflow soldered. Once the first side has been cooled, the first side components are fitted with individual heatsinks or a heatsink plate may be attached to multiple components. The product then has its second side reflow soldered, with the heatsinks or heatsink plate providing sufficient heat removal such that the solder on the first side does not melt and the previously soldered first side components do not shift position or fall off. The drawbacks of a process such as this include the requirement of special tooling and fixturing for each type of product being assembled.

SUMMARY OF THE INVENTION

A solder reflow bottom cooling apparatus and method is disclosed. A bottom cooling assembly provides cold gas to a first side of a product at approximately the same time a second side of the product is being reflow soldered. The bottom cooling assembly comprises a compressed gas source supplying compressed gas to one or more nozzles which are directed to blow upon one side of the product as the opposite side of the product is being reflow soldered. A temperature separator isolates the hot gas environment from the cold gas environment. Accordingly, only the solder on one side of the product melts, while the solder on the opposite side of the product remains solid. As a result, components on one side of the product are reflow soldered, while previously soldered components on the other side of the product are undisturbed.

BRIEF DESCRIPTION OF THE DRAWINGS

The invention will be more fully understood from the following detailed description taken in conjunction with the accompanying drawings in which.

DETAILED DESCRIPTION

Figure 1:
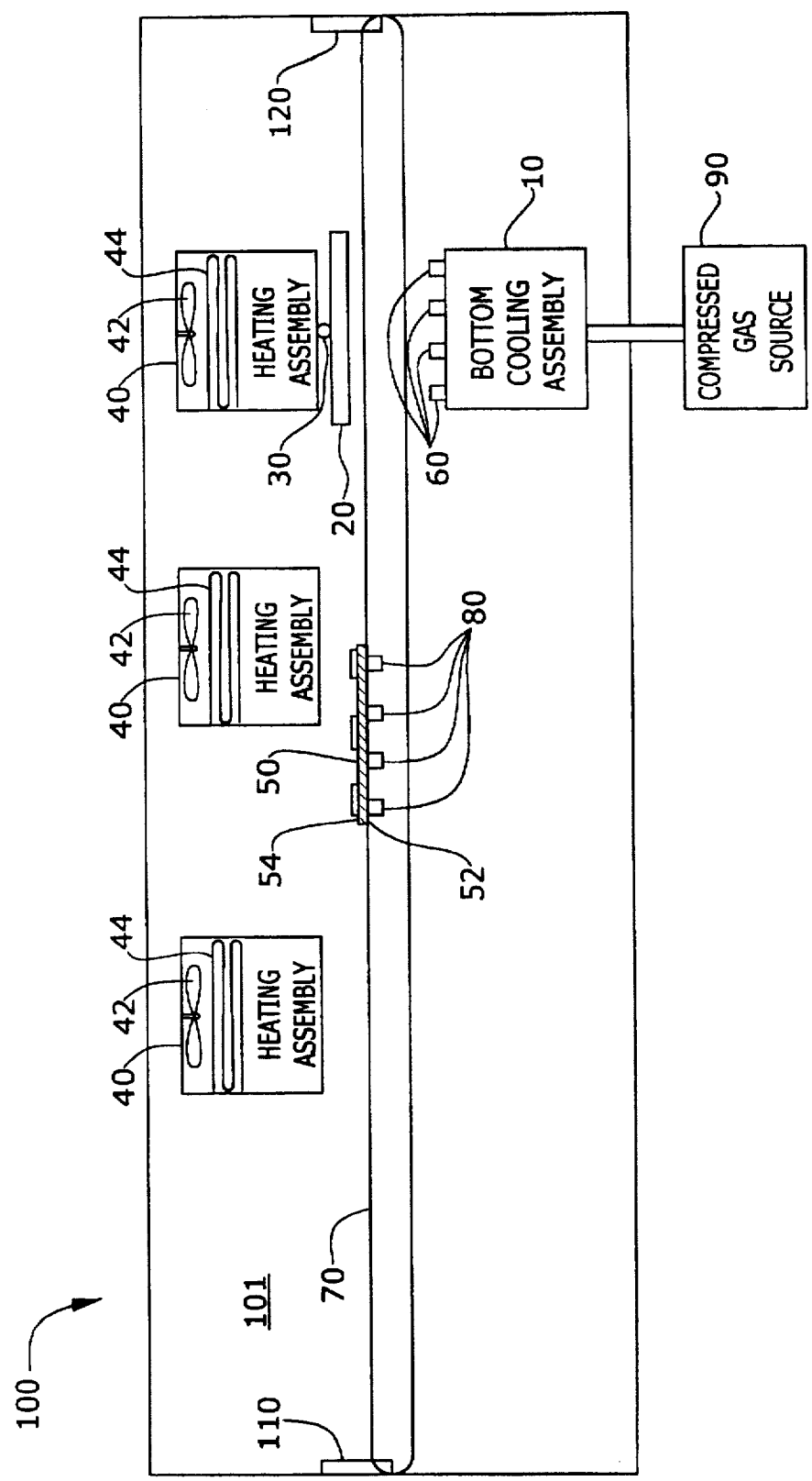
FIG. 1 is a side view of the solder reflow furnace incorporating a heating assembly, a cooling assembly and a temperature separator.
Figure 2:
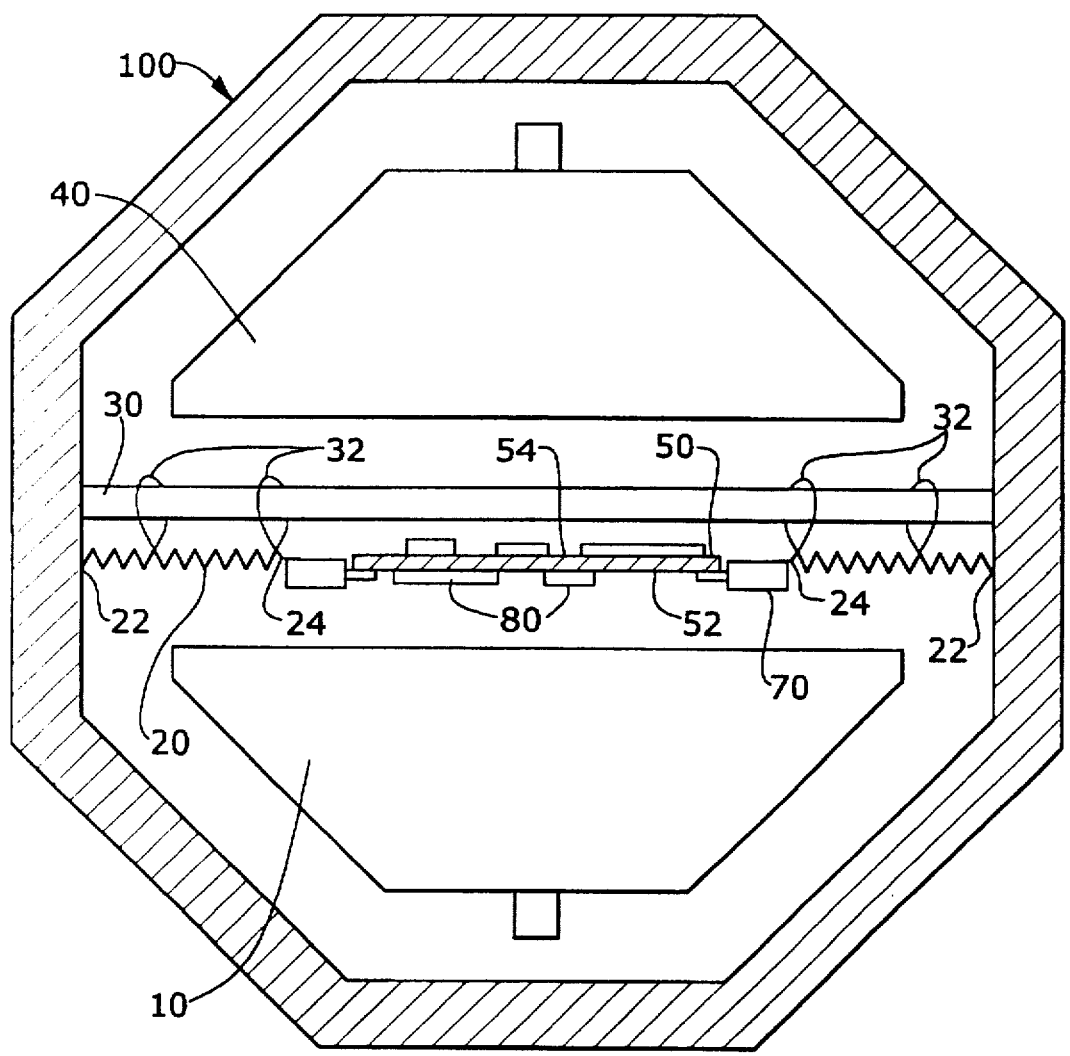
FIG. 2 is a cross sectional view of the solder reflow furnace of FIG. 1.

FIGS. 1 and 2 show a solder reflow furnace 100 according to the present invention. A transport assembly 70, which can be a conveyor belt, rollers, a walking beam, or the like, transports product, in this embodiment a circuit board 50, through a furnace chamber 101, from furnace inlet 110 to furnace outlet 120. The circuit board 50 has previously had first side components 80 soldered onto its first side 52. Circuit board 50 is arranged on transport assembly 70 such that the first side 52 is facing downward, and the second side 54 is facing upward. As the transport assembly 70 conveys the circuit board 50 through the furnace chamber 101, the circuit board 50 is brought into heat transfer proximity with hot gas provided by heating assemblies 40 which are disposed above the product 50.

The furnace 100 has at least one heating assembly 40 for reflow soldering components on an upwardly facing side of the circuit board 50. The heating assembly 40 may comprise any convection heating source such as an electric heater including a blower assembly, IR heaters, or the like. In a particular embodiment, three heating assemblies 40 are employed to bring the temperature of the circuit board 50 up to or above the melting temperature of the solder. The heating assemblies 40 in this embodiment are electrical heaters having a fan or blower assembly 42 disposed above heater coils 44, and which direct a flow of heated air onto the product being reflow soldered.

The furnace 100 also has a bottom cooling assembly 10 for directing cooler gas to the downwardly facing side of the product while the upwardly facing side is heated. At approximately the same time the second side 54 of circuit board 50 is being reflow soldered, the first side 52 of circuit board 50 is in heat transfer proximity with the bottom cooling assembly 10, which is disposed underneath the circuit board 50. The bottom cooling assembly 10, which may include a gas amplifier, a gas blower or other gas moving device, in this embodiment comprises four nozzles which direct cold gas at a flow rate of approximately 50 liters/minute, and at an approximate temperature of 80° C., onto the first side of the circuit board 50. Generally, the bottom cooling assembly is located beneath the zone or zones in which the temperature exceeds the solder reflowing temperature. The bottom cooling assembly 10 receives compressed gas, which can be either air or $N_2$, from a compressed gas source 90, which can be a gas tank or compressor. Other temperatures and flow rates may be used depending on the requirements of the product being soldered and the particular solder being used.

A temperature separator 20 is disposed between the heating assembly 40 and the bottom cooling assembly 10. The temperature separator 20 isolates a hot gas environment on one side of the separator 20 from a cold gas environment on the other side of the separator 20. The temperature separator 20 may be adjustable in width to accommodate different sized products. In this embodiment the temperature separator 20 comprises an accordion folded curtain comprised of fire retardant material disposed on each side of transport element 70. A suitable fire retardant material is a Nomex/Kevlar® blend, available from Centryco, of Burlington, N.J. The curtain 20 is affixed along one edge 22 to the interior wall of the furnace 100 and along the opposite edge 24 to the transport element 70. The curtain 20 is suspended at suitable locations by rings 32 from one or more support rods 30 extending at intervals transversely across the furnace 100. The curtain 20 is thus able to expand or contract as the transport element 70 is narrowed or widened. The curtain 20 may extend the entire length of the furnace chamber 101 or any suitable portion of the length of the furnace. In other embodiments the separator 20 could be comprised of any material which serves to isolate the hot gas environment from the cold gas environment.

As the second side of the circuit board 50 comes into heat transfer proximity with the hot gas provided by the heating assembly 40, the temperature at the second side of the circuit board 50 rises. When the second side of the circuit board 50 is at or above a high enough temperature, approximately 183° C. in this embodiment, preformed solder, which has been previously deposited on the second side of circuit board 50, melts. The bottom cooling assembly 10 maintains the temperature at the first side of the circuit board 50 below the melting temperature (approximately 183° C.) of the preformed solder deposited and previously reflowed on the first side of circuit board 50. In such a manner, the solder on the first side of the circuit board 50 is prevented from melting; thus, the components 80 on the first side of the circuit board 50 does not fall off or shift position and is able to maintain mechanical and electrical connections between the component 80 and the first side surface of the circuit board 50, while the components on the second side of the circuit board 50 are being reflow soldered.

With such a process and apparatus a double sided circuit board can be reflow soldered without having to affix components to the first side via adhesives, without requiring the use of different temperature solders, without the use of additional heat sinks or fixtures, and without relying on the surface tension of the molten solder to prevent movement of the previously soldered first side components. Accordingly, double sided product can be more easily reflow soldered.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

We claim:

1. A solder reflow furnace comprising:
   a transport element disposed within the solder reflow furnace;
   a heating assembly disposed within the solder reflow furnace above said transport element, said heating assembly dispensing hot gas;
   a cooling assembly disposed within said solder reflow furnace below said transport element, said cooling assembly dispensing cold gas; and
   whereby a product having a first side and a second side is brought on said transport element into heat transfer proximity with the hot gas provided by the heating assembly and the cold gas provided by said cooling assembly such that solder on the second side of the product melts and solder on the first side of the product remains solid.

2. The solder reflow furnace of claim 1 further including a temperature separator disposed between said heating assembly and said cooling assembly.

3. The solder reflow furnace of claim 1 wherein the hot gas and the cold gas comprise air.

4. The solder reflow furnace of claim 1 wherein the hot gas and the cold gas comprise $N_2$.

5. The solder reflow furnace of claim 1 wherein said cooling assembly includes a gas amplifier.

6. The solder reflow furnace of claim 1 wherein said cooling assembly includes a gas blower.

7. The solder reflow furnace of claim 1 wherein said cooling assembly comprises one or more nozzles coupled to a compressed gas source.

8. The solder reflow furnace of claim 1 wherein said cooling assembly provides cold gas from approximately 20° C. to 180° C.

9. The solder reflow furnace of claim 1 wherein said cooling assembly provides cold gas at approximately 80° C.

10. The solder reflow furnace of claim 1 wherein the flow rate of the cold gas is approximately 5 to 100 liters/minute.

11. The solder reflow furnace of claim 1 wherein the flow rate of the cold gas is approximately 50 liters/minute.

12. The solder reflow furnace of claim 2 wherein said temperature separator is adjustable in width.

13. The solder reflow furnace of claim 2 wherein said temperature separator comprises a curtain suspended from a rod assembly to extend between edges of the solder reflow furnace and the transport element.

14. The solder reflow furnace of claim 2 wherein said temperature separator comprises fire retardant material.

15. The solder reflow furnace of claim 7 wherein said compressed gas source is a tank.

16. The solder reflow furnace of claim 7 wherein said compressed gas source is a compressor.

* * * * *